United States Patent [19]
Dutta et al.

[11] Patent Number: 5,264,711
[45] Date of Patent: Nov. 23, 1993

[54] METAL-ENCAPSULATED QUANTUM WIRE FOR ENHANCED CHARGE TRANSPORT

[75] Inventors: Mitra Dutta, Matawan, N.J.; Harold L. Grubin, West Hartford, Conn.; Gerald J. Iafrate, Raleigh, N.C.; Ki Wook Kim; Michael A. Stroscio, both of Durham, N.C.

[73] Assignee: The United States of America as represented by the Secretary of the Army, Washington, D.C.

[21] Appl. No.: 945,040

[22] Filed: Sep. 15, 1992

[51] Int. Cl.$^5$ .......................................... H01L 29/02
[52] U.S. Cl. ..................... 257/14; 257/17; 257/22; 257/27; 257/774; 257/771
[58] Field of Search .............. 257/21, 17, 15, 14, 257/774, 775, 773, 20, 22, 27, 771

[56] References Cited

U.S. PATENT DOCUMENTS

| | | | |
|---|---|---|---|
| 4,503,447 | 3/1985 | Iafrate et al. | 257/15 |
| 4,591,889 | 5/1986 | Gossard et al. | 257/15 |
| 4,733,282 | 3/1988 | Chang et al. | 257/14 X |
| 4,751,194 | 6/1988 | Cibert et al. | 257/14 X |
| 4,769,683 | 9/1988 | Goronkin et al. | 257/20 |
| 4,899,201 | 2/1990 | Xu et al. | 257/20 |
| 5,119,151 | 6/1992 | Onda | 257/14 |

OTHER PUBLICATIONS

Hong et al., "MBE Growth and Properties of Fe, (AlSi) on GaAs (100)", *Journal of Crystal Growth*, vol. 111, 1991, pp. 984–988.

Ralston et al., "Overgrowth and Strain in MBE-Grown GaAs/ErAs/GaAs Structures," *Journal of Crystal Growth*, vol. 111, 1991, pp. 989–995.

Kuo et al. "Rheed Studies of Epitaxial Growth of CoGa on GaAs by MBE Determination of Epitaxial Phases and Orientations," *Journal of Crystal Growth*, vol. 111, 1991, pp. 996–1002.

H. Sakaki, Japanese Journal of Applied Physics, "Superlattices and Coupled Quantum Box Arrays: A Novel Method to Suppress Optical Phonon Scattering in Semiconductors", 28, L314, 1989.

S. Luryi and F. Capasso, "Resonant Tunneling of Two-Dimensional Electrons though a Quantum Wire: A Negative Transconductance Device", Applied Physics Letters, 47, 1347, 1985.

M. Tsuchiya et al, "Optical Anisotropy in a Quantum-Well-Wire Array with Two-Dimensional Quantum Confinement", Physical Review Letters, 62, 466, 1989.

M. A. Reed et al, "Observation of Discrete Electronic States in a Zero-Dimensional Semiconductor Nanostructure", Physical Review Letters, 60, 535, 1988.

Michael A. Stroscio, "Interaction between longitudinal-optical phonon modes of a rectangular quantum wire and charge carriers of a one-dimensional electron gas", Physical Review, B, 40, 6428, 1989.

N. Mori et al, "Electron-optical-phonon interaction in single and double heterostructures", Physical Review B, 40, 6175, 1989.

K. W. Kim et al, "Electron-optical-phonon scattering rates in a rectangular semiconductor quantum wire", Journal of Applied Physics, 70, 319, 1991.

M. A. Stroscio et al, "Transition from longitudinal-optical phonon scattering to sruface-optical phonon scattering in polar semiconductor superlattices", Applied Physics Letters, 59, 1093, 1991.

J. P. Harbison et al, "MBE growth of ferromagnetic metastable epitaxial MnAl thin films on AlAs/GaAs heterostructures", *Journal of Crystal Growth*, vol. 111, 1991, pp. 978–981.

*Primary Examiner*—William Mintel
*Attorney, Agent, or Firm*—Michael Zelenka; William H. Anderson

[57] ABSTRACT

A polar semiconductor quantum wire for use in electronic and opto-electronic devices. The polar semiconductor quantum wire is either completely or partially encapsulated in metal to reduce the strength of the scattering potential associated with interface optical phonons normally established at the lateral boundaries of polar semiconductor quantum wires. Metal alone or metal employed in conjunction with modulation doping enhances the transport of charge carriers within the polar semiconductor quantum wire.

17 Claims, 3 Drawing Sheets

METAL-ENCAPSULATED QUANTUM WIRE FOR ENHANCED CHARGE TRANSPORT

GOVERNMENT INTEREST

The invention described herein may be manufactured, used, and licensed by or for the Government of the United States of America for governmental purposes without the payment to us of any royalty thereon.

BACKGROUND OF THE INVENTION

1. Field of the Invention

This invention relates to the field of electronic and opto-electronic devices that rely upon quantum-wire structures for charge transport between device components as well as for charge transport within active wire-like elements of device components.

2. Description of the Prior Art

As originally proposed by H. Sakaki in the *Japanese Journal of Applied Physics*, 19, L735, 1980, the predicted high mobilities of quasi-one-dimensional wire-like regions of semiconducting material underlie many proposed quantum-wire system concepts. Such a system concept is the quantum-wire array described by H. Sakaki in the *Japanese Journal of Applied Physics*, 28, L314, 1989. Enhanced carrier mobility is achieved in the subject quantum-wire array by engineering the minibands of the array so that longitudinal-optical (LO) phonon transitions are forbidden. As a second example of the utility of the semiconductor quantum wire is found in S. Luryi and F. Capasso, *Applied Physics Letters*, 47, 1347, 1985, in which a novel three-terminal resonant-tunneling structure is based on resonant tunneling of a two-dimensional electron gas into a gated one-dimensional quantum wire to produce a negative transconductance. The experimental realization of such a device would portend applications for low-power logic circuits. Quantum wire arrays have also been considered as potential low-current-threshold semiconductor lasers; in fact, there have been indications of strong optical anisotropy in such quantum-wire arrays as reported by M. Tsuchiya, J. M. Gaines, R. H. Yan, R. J. Simes, P. O. Holtz, L. A., Coldren, and P. M. Petroff, *Physical Review Letters*, 62, 466, 1989. Other efforts on the fabrication and characterization of quantum-wire structures have been reported by M. A. Reed, J. N. Randall, R. J. Aggarwal, R. J. Matyi, T. M. Moore, and A. E. Wetsel, *Physical Review Letters*, 60, 535, 1988 in connection with quantum-coupled electron device architectures and by M. Watt, C. M. Sotomayer Torres, H. E. G. Arnot, and S. P. Beaumont, *Semiconductor Science and Technology*, 285, 1990.

Recently, however, theoretical studies of the interaction between LO phonons and carriers in polar-semiconductor quantum wires, such as M. A. Stroscio, *Physical Review*, B40, 6428, 1989, have revealed the presence of discrete LO phonon modes similar to those identified earlier for polar-semiconductor quantum wells as discussed recently by N. Mori and T. Ando in *Physical Review*, B40, 6175, 1989. As for quantum wells, interface LO phonons are established at the semiconductor-semiconductor boundaries of quantum wires as described by K. W. Kim, M. A. Stroscio, A. Bhatt, R. Mickevicius and V. V. Mitin in the *Journal of Applied Physics*, 70, 319, 1991 where interface-phonon scattering effects are demonstrated to be a major source of scattering for electrons confined in the extreme quantum limit for wires with lateral dimensions less than about 40 Angstroms. As recently demonstrated by M. A. Stroscio, G. J. Iafrate, K. W. Kim, M. A. Littlejohn, H. Goronkin and G. N. Maracas in *Applied Physics Letters*, 59, 1093, 1991, interface-phonon scattering is a major contributor to carrier scattering in superlattices with structure dimensions of about 150 Angstroms or less. Experimental evidence for the enhancement of carrier-interface-phonon scattering as quantum well dimensions are reduced has been reported by K. T. Tsen, D. S. Smith, S. C. Y. Tsen, N. S. Kumar, and H. Morkoc in the *Journal of Applied Physics*, 70, 418, 1991. This enhanced inelastic carrier-interface-phonon scattering for confinement dimensions of less than roughly 100 Angstroms is undesirable since it reduces carrier mobility. Recent progress in the area of epitaxially-matched, metal to semiconductor interfaces in quantum-well devices has been made. J. P. Harbison, T. Sands, N. Tabatabaie, W. K. Chan, L. T. Florez, and V. G. Kermidas have reported on structures containing such metal-semiconductor interfaces in *Applied Physics Letters*, 53, 1717, 1988 and in the *Journal of Crustal Growth*, 95, 425, 1989. Additional papers reporting such results are A. Givarclh, J. Caulet, B. Guernais, Y. Ballini, R. Guerin, A. Poudoulec, and A. Regreny in the *Journal of Crustal Growth*, 95, 427, 1989 and N. Tabatabaie, T. Sands, J. P. Harbison, H. L. Gilchrist and V. G. Kermidas in *Applied Physics Letters*, 53, 2528, 1988.

SUMMARY OF THE INVENTION

One object of the invention is to provide a means to improve carrier transport in quantum wires. A second object of the invention is to eliminate o reduce interface phonon modes in quantum wires through the introduction of metal-semiconductor heterojunctions at the lateral boundaries of the quantum wire. A third object of the invention is to eliminate or reduce interface phonon modes in quantum wires by combining partial encapsulation of the quantum wire in metal with modulation doping of the quantum wire. Another object of the invention is to provide quantum-wire cross sections of varying shapes, i.e., rectangular, circular, or arbitrary shapes. A still further object of the invention is to provide quantum-wire cross sections that vary along the length of the quantum wire.

DETAILED DESCRIPTION OF THE PREFERRED EMBODIMENT

Figure 1:
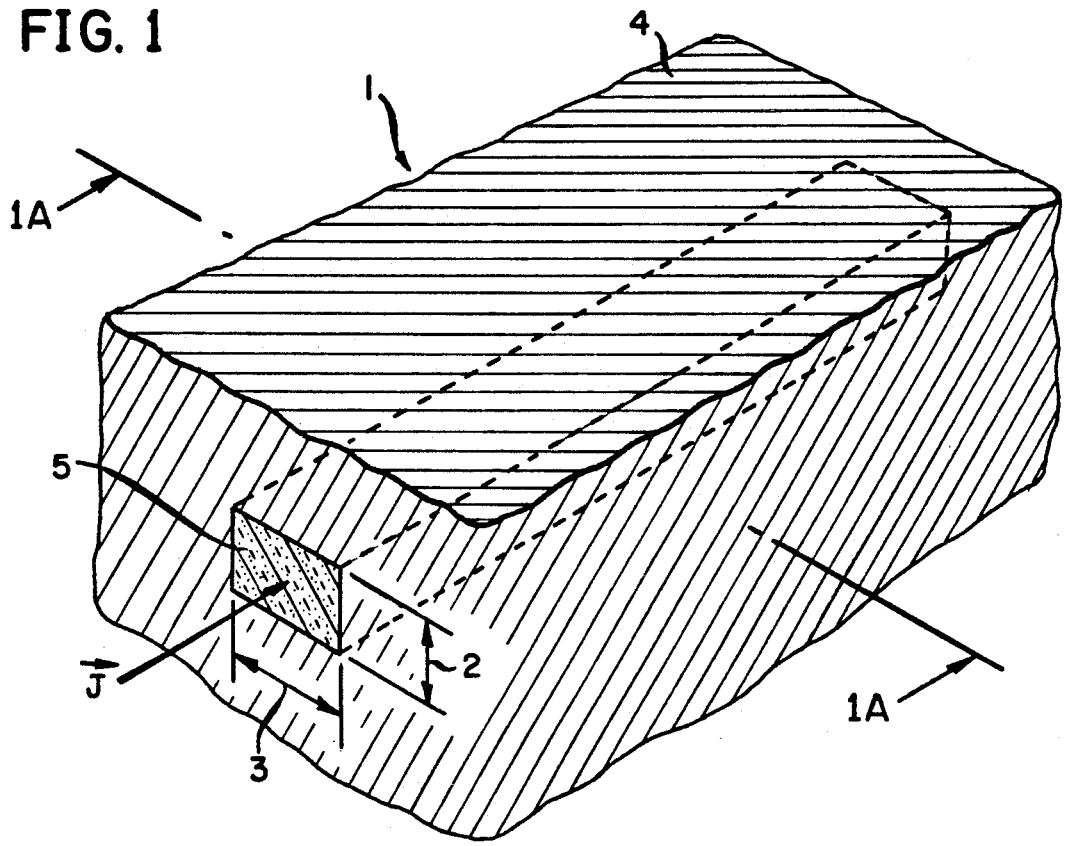
FIG. 1 is a pictorial view of a rectangular quantum wire encapsulated in metal.

According to the invention there is further provided a region of metal encapsulation around the lateral surfaces of the charge transporting quantum wire. Such regions of metal encapsulation are shown in FIGS. 1 through 4. To enhance high-mobility transport in the quantum wire it is desirable to have uniform and smooth metal-semiconductor interfaces. In FIG. 1, a rectangular quantum wire 5 is encapsulated on all lateral surfaces by a metal 4. The ends of the quantum wire would be free of metal to a degree sufficient to allow entry and exit points for current J. The rectangular quantum wire has a fixed length 1, height 2, and width 3. In FIG. 1 the current J is depicted traveling along the x axis of the quantum wire.

Figure 2:
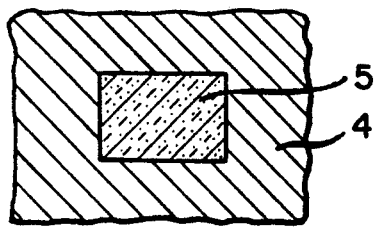
FIG. 2 depicts a cross section of the quantum wire depicted in FIG. 1 along line IA—IA.
Figure 3:
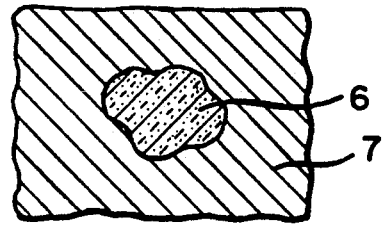
FIG. 3 is a pictorial view of a cross section of an arbitrarily-dimensioned quantum wire.
Figure 4:
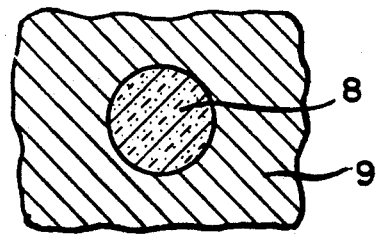
FIG. 4 is a pictorial view of a cross section of a circular quantum wire.

FIG. 2 depicts a cross section of the quantum wire in FIG. 1 along line 1A—1A, showing graphically that each lateral surface of the quantum wire 5 is in contact with metal 4. FIG. 3 depicts a cross section of quantum wire having an arbitrary cross section 6 with each lateral surface of the quantum wire 6 in contact with metal 7. Similarly, FIG. 4 depicts a cross section of quantum wire having a circular cross section 8 with each lateral surface of the quantum wire 8 in contact with metal 9. It is understood that a single quantum wire may possess variable cross sections, i.e., at any point along its length it may vary from circular, to rectangular, to arbitrary, depending on its function within a device or design constraints imposed upon the device.

To facilitate the growth of uniform and smooth metal-semiconductor interfaces it may be advisable to select metal-semiconductor combinations such as Fe-GaAs which have lattice constants differing approximately by a multiple of an integer. Similar metal-semiconductor combinations include NiAl-AlAs, MnAl-AlAs, and CoAl-AlAs. Selecting metals with lattice constants less than that of the semiconductor enhances the possibility of recovering the electronic properties of the bulk metal in the minimum distance into the metal from the metal-semiconductor interface. Fe has a lattice constant about one-half that of GaAs so the Fe-GaAs system satisfies the condition of having lattice constants differing by an integral multiple as well as the condition of having the lattice constant of the metal being less than that of the semiconductor. Finally, as will be explained in the next paragraph, it may be desirable to select a metal with a large magnetic permeability since the classical penetration distance of the LO phonon field into a metal may be reduced as the magnetic permeability is increased.

It has been demonstrated recently by Michael A. Stroscio, K. W. Kim, Gerald J. Iafrate, Mitra Dutta and Harold L. Grubin in the *Proceedings of the 1991 International Semiconductor Device Research Symposium*, pages 87–91, 1991 Engineering Academic Outreach Publication, School of Engineering and Applied Science, University of Virginia, (ISBN Number: 1-880920-00-X), Dec. 4–6, 1991, that the interface LO phonon potential vanishes as the interface phonon attempts to penetrate from a polar semiconductor into a metal. This vanishing of the interface LO phonon mode coupled with the fact that the interface phonon modes are long-range Coulomb modes, as discussed in S. Baroni, P. Giannozzi and E. Molinari, *Physical Review*, B41, 3870, 1991, implies that encapsulating a substantial fraction of the quantum-wire lateral surfaces with metal will eliminate or greatly reduce the strength of the interface LO phonon potential. Consequently unwanted inelastic scattering due to the interface LO modes, which dominates for small (<100 Angstroms) dimensional scales, is reduced or eliminated by the metal encapsulation depicted in FIGS. 1 through 4.

Figure 5A:
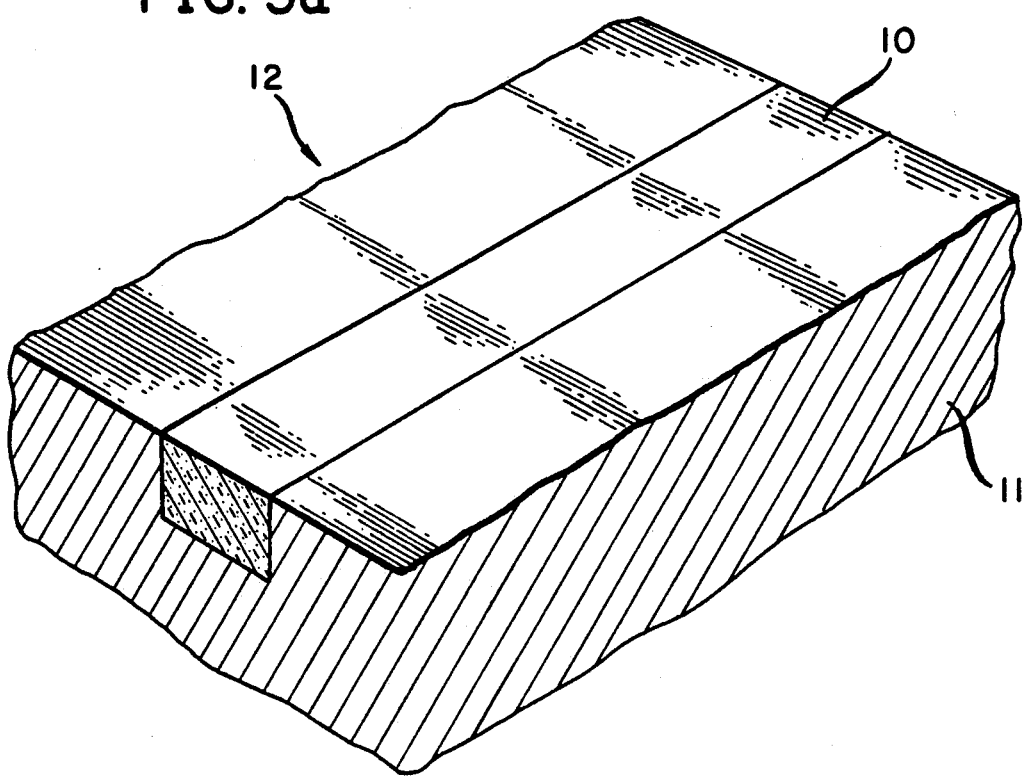
FIG. 5(a) is a pictorial view of a rectangular quantum wire encapsulated with metal on three sides and with a vacuum on its upper lateral surface.

Enhanced carrier mobility can be realized with less than complete encapsulation of the quantum wire. The long-range interface LO phonon potential will also be reduced significantly by partial metal encapsulation of quantum wires as depicted in FIGS. 5 and 6. In FIG. 5, a polar semiconductor quantum wire 10 is shown encapsulated in metal 11 on three of its lateral surfaces. The remaining lateral surface of the quantum wire 10 is exposed to a vacuum 12.

Figure 5B:
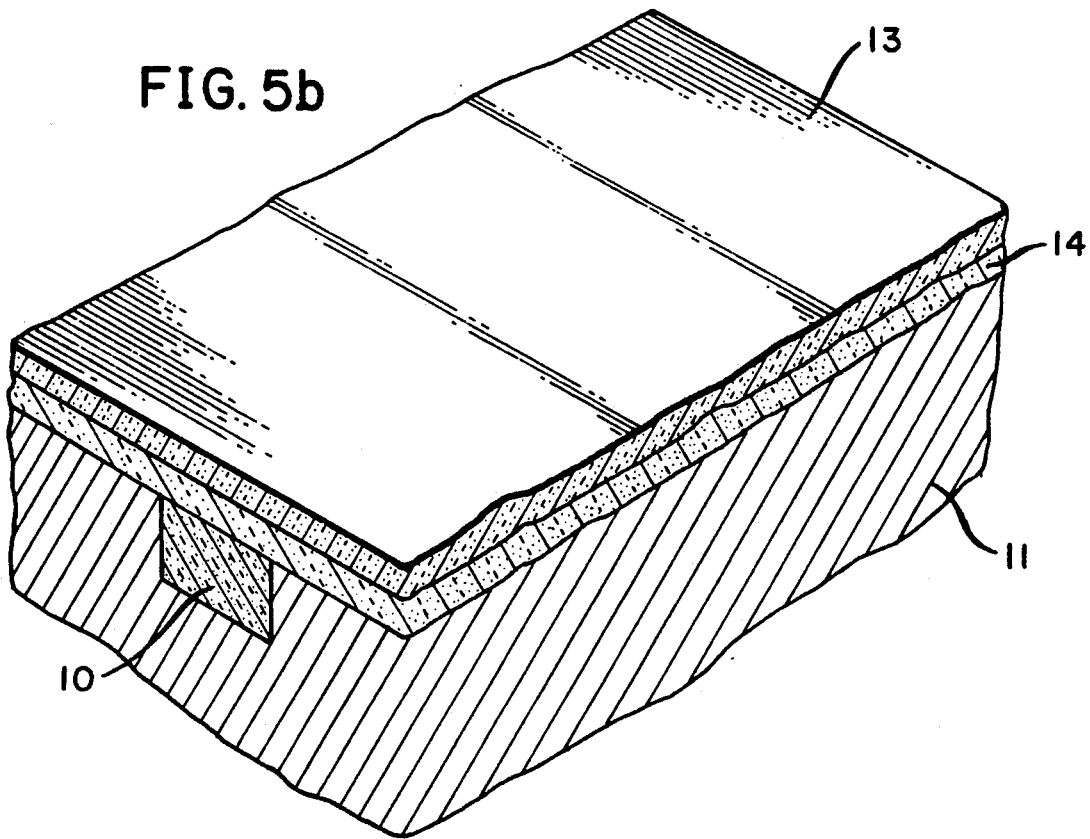
FIG. 5b) is a pictorial view of a rectangular quantum wire encapsulated with metal on three sides and with a layered semiconductor structure on its upper lateral surface.

In all of the embodiments discussed above, carriers may be depleted from the semiconductor near the metal-semiconductor interface. The extent of depletion of minority and majority carriers will depend upon the properties of the bulk metal and semiconductor as well as on the equilibrium established at the metal-semiconductor interface. To enhance the carrier confinement density in the quantum wires of FIG. 5(a), the vacuum region bounding the top lateral surface of the quantum wires may be replaced by a layered semiconductor structure. In FIG. 5(b) the polar semiconductor quantum wire 10 is again shown encapsulated in metal 11. In this instance, however, the remaining lateral surface of the quantum wire 10 is bounded by a semiconductor lattice layer 14 which is matched to the polar semiconductor quantum wire 10. The semiconductor lattice layer 14 is in turn bounded by a polar or non-polar semiconductor 13. Through modulation doping of the semiconductor lattice layer 14 bounding the quantum wire 10 the carrier confinement density in the quantum wire 10 may be increased.

Figure 6A:
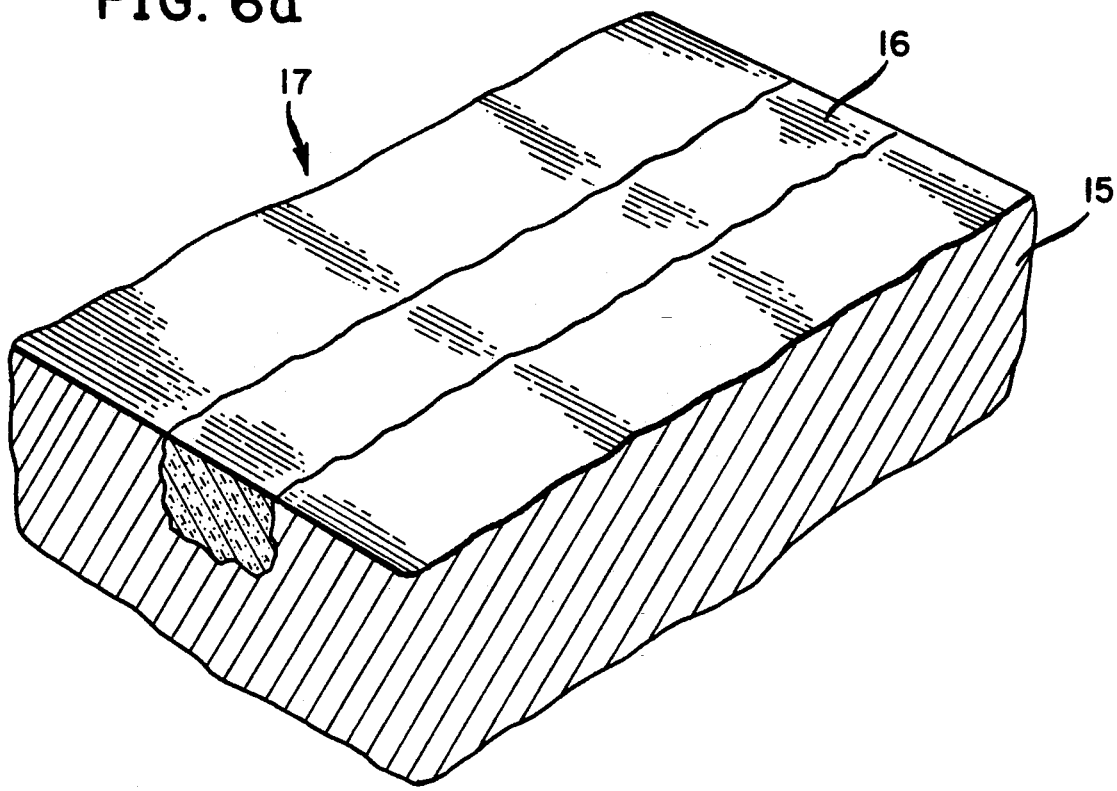
FIG. 6(a) is a pictorial view of the structure of FIG. 5(a) where the rectangular quantum wire is replaced with a quantum wire of arbitrary cross section.
Figure 6B:
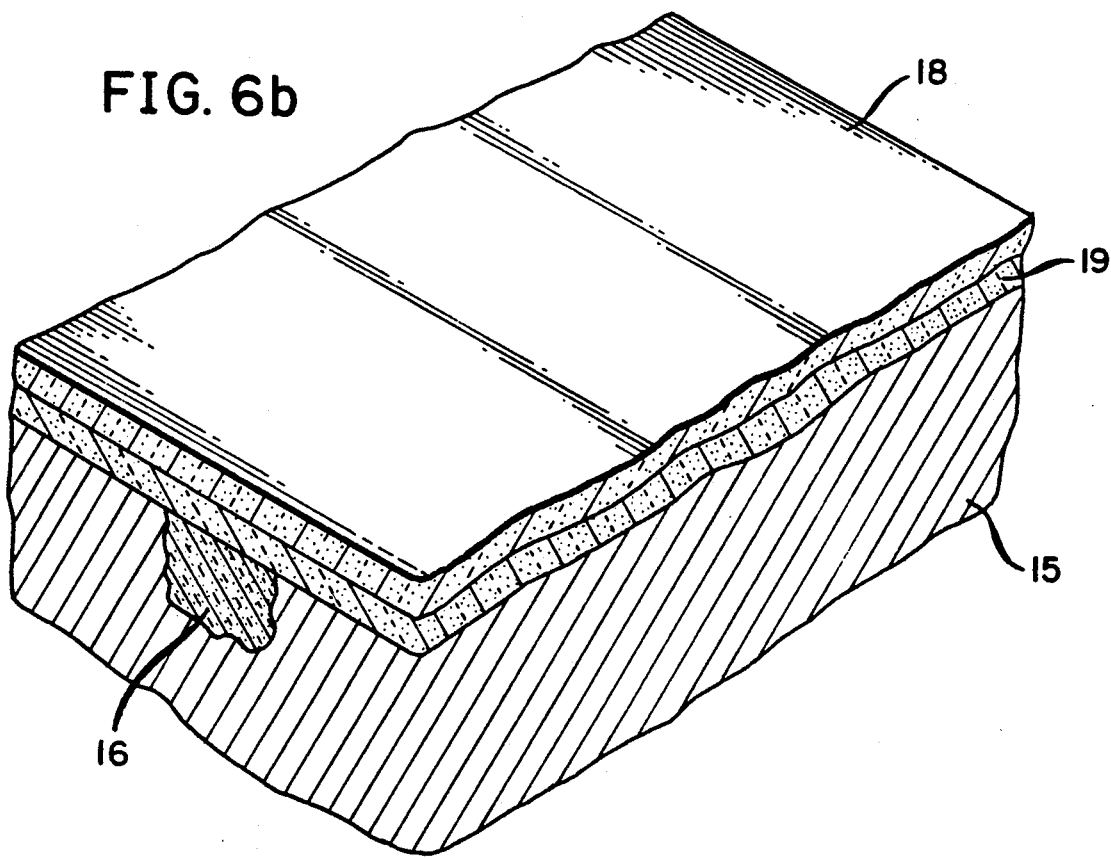
FIG. 6(b) is a pictorial view of illustrates the structure of FIG. 5(b) where the rectangular quantum wire is replaced with a quantum wire of arbitrary cross section.

In FIG. 6(a), a polar semiconductor quantum wire 16 with an arbitrary cross section is shown encapsulated in metal 15 on approximately 75% of its lateral surface. The remaining lateral surface of the quantum wire 16 is exposed to a vacuum 17. FIG. 6(b) depicts the polar semiconductor quantum wire of FIG. 6(a) 16 again encapsulated in metal 15 with the remaining lateral surface of the quantum wire 15 bounded by a semiconductor lattice layer 19 which is matched to the polar semiconductor quantum wire 15. The semiconductor lattice layer 19 is in turn bounded by a polar or non-polar semiconductor 18. Through modulation doping of the semiconductor lattice layer 19 bounding the quantum wire 16, the carrier confinement density in the quantum wire 16 may be increased.

Because of the practical difficulties in achieving consistently uniform and smooth metal-semiconductor interfaces, it is envisioned that FIGS. 5(b) and 6(b) represent the best mode of practicing the invention.

Alternate embodiments of the structures depicted in FIGS. 5(a), 5(b), 6(a) and 6(b) include structures where arrays of parallel quantum wires replace the single quantum wire as well as structures where the quantum wires are bounded by multiple regions of metal and other materials such as insulators, semiconductors and vacuum.

The embodiments of FIGS. 5(b) and 6(b) are preferred when carrier densities must be enhanced above the level remaining after depletion of the semiconductor near the metal-semiconductor interface. Other embodiments may be used when the remaining density of either majority or minority carriers is adequate after depletion.

What is claimed is:

1. A partially metal-encapsulated quantum wire for enhanced charge transport comprising:
   a polar semiconductor quantum wire having a lateral exterior surface and having a lattice constant of predetermined value; and
   a metal encapsulation abutting at least a fifty percent portion of the lateral exterior surface of said polar semiconducting quantum wire thereby leaving an exposed surface of said polar quantum wire, said metal encapsulation having a lattice constant of predetermined value.

2. The partially metal-encapsulated quantum wire of claim 1 wherein said metal is magnetic.

3. The partially metal-encapsulated quantum wire of claim 1 wherein the lattice constant of said polar semiconductor quantum wire is an integral multiple of the lattice constant of said metal.

4. The partially metal-encapsulated quantum wire of claim 1 wherein a cross-section of said polar semiconductor quantum wire is rectangular.

5. The partially metal-encapsulated quantum wire of claim 1 wherein a cross-section of said polar semiconductor quantum wire is circular.

6. A completely metal-encapsulated quantum wire for enhanced charge transport comprising:
   a polar semiconductor wire having a lateral exterior surface and having a lattice constant of predetermined value; and
   a layer of metal completely encapsulating the lateral exterior surface of said polar semiconducting quantum wire, said layer of metal having a lattice constant of predetermined value.

7. The completely metal-encapsulated quantum wire of claim 6 wherein said metal is magnetic.

8. The completely metal-encapsulated quantum wire of claim 6 wherein the lattice constant of said polar semiconductor quantum wire is an integral multiple of the lattice constant of said metal.

9. The completely metal-encapsulated quantum wire of claim 6 wherein a cross-section of said polar semiconductor quantum wire is rectangular.

10. The completely metal-encapsulated quantum wire of claim 6 wherein a cross-section of said polar semiconductor quantum wire is circular.

11. The completely metal-encapsulated quantum wire of claim 1 wherein said polar semiconductor quantum wire is AlAs and said metal is selected from the group including NiAl, MnAl, and CoAl.

12. The partially metal-encapsulated quantum wire of claim 6 wherein said polar semiconductor quantum wire is AlAs and said metal is selected from the group including NiAl, MaAl, and CoAl.

13. The completely metal-encapsulated quantum wire of claim 1 wherein said polar semiconductor quantum wire is GaAs and said metal is Fe.

14. The partially metal-encapsulated quantum wire of claim 6 wherein said polar semiconductor quantum wire is GaAs and said metal is Fe.

15. The partially metal-encapsulated quantum wire of claim 1 wherein the metal encapsulation abuts at least a seventy five percent portion of said polar quantum wire.

16. The partially metal-encapsulated quantum wire of claim 1 further comprising a semiconductor lattice abutting the exposed surface of the polar quantum wire, the semiconductor lattice being comprised of at least two different semiconductor materials.

17. The partially metal-encapsulated quantum wire of claim 16 wherein one of the semiconductor materials comprising the semiconductor lattice is modulation doped.

* * * * *